US009873789B2

(12) United States Patent
Zeng et al.

(10) Patent No.: US 9,873,789 B2
(45) Date of Patent: Jan. 23, 2018

(54) HALOGEN-FREE EPOXY RESIN COMPOSITION, PREPREG AND LAMINATE USING SAME

(71) Applicant: SHENGYI TECHNOLOGY CO., LTD., Dongguan, Guangdong (CN)

(72) Inventors: Xianping Zeng, Dongguan (CN); Liexiang He, Dongguan (CN)

(73) Assignee: SHENGYI TECHNOLOGY CO., LTD., Dongguan (CN)

( * ) Notice: Subject to any disclaimer, the term of this patent is extended or adjusted under 35 U.S.C. 154(b) by 0 days.

(21) Appl. No.: 15/118,204

(22) PCT Filed: Jun. 1, 2015

(86) PCT No.: PCT/CN2015/080537
§ 371 (c)(1),
(2) Date: Aug. 11, 2016

(87) PCT Pub. No.: WO2016/101540
PCT Pub. Date: Jun. 30, 2016

(65) Prior Publication Data
US 2017/0283609 A1   Oct. 5, 2017

(30) Foreign Application Priority Data
Dec. 26, 2014 (CN) .......................... 2014 1 0831480

(51) Int. Cl.
| | | |
|---|---|---|
| C08L 63/00 | (2006.01) | |
| C08L 63/04 | (2006.01) | |
| C08G 59/62 | (2006.01) | |
| C08G 59/42 | (2006.01) | |
| C08J 5/24 | (2006.01) | |
| C08J 5/04 | (2006.01) | |
| C08J 5/10 | (2006.01) | |
| C08G 59/68 | (2006.01) | |
| H05K 1/03 | (2006.01) | |

(52) U.S. Cl.
CPC .......... *C08L 63/04* (2013.01); *C08G 59/4238* (2013.01); *C08G 59/4284* (2013.01); *C08G 59/621* (2013.01); *C08G 59/685* (2013.01); *C08G 59/686* (2013.01); *C08J 5/043* (2013.01); *C08J 5/10* (2013.01); *C08J 5/24* (2013.01); *H05K 1/0373* (2013.01); *C08J 2363/04* (2013.01); *C08J 2425/08* (2013.01); *C08J 2461/14* (2013.01); *C08L 2201/02* (2013.01); *C08L 2201/22* (2013.01); *C08L 2203/20* (2013.01); *C08L 2205/05* (2013.01)

(58) Field of Classification Search
CPC .. C08L 63/04; C08L 2205/05; C08L 2203/20; C08L 2201/02; C08L 2201/22; C08G 59/621; C08G 59/4238; C08G 59/4284; C08G 59/686; C08G 59/685; C08J 5/24; C08J 5/043; C08J 5/10; C08J 2363/04; C08J 2425/08; C08J 2461/14; H05K 1/0373
USPC ........................................................ 523/435
See application file for complete search history.

(56) References Cited

U.S. PATENT DOCUMENTS

| | | | |
|---|---|---|---|
| 4,927,736 A | 5/1990 | Mueller et al. | |
| 2013/0161080 A1* | 6/2013 | Lin ......................... | C08L 79/04 |
| | | | 174/257 |
| 2017/0002131 A1 | 1/2017 | Zeng et al. | |

FOREIGN PATENT DOCUMENTS

| | | | | |
|---|---|---|---|---|
| CN | 1680375 | A | 10/2005 | |
| CN | 102134375 | A | 7/2011 | |
| CN | 102206397 | A | 10/2011 | |
| CN | 102516541 | A | 6/2012 | |
| CN | 102558858 | A | 7/2012 | |
| CN | 102732029 | A | 10/2012 | |
| CN | 102850545 | A | 1/2013 | |
| CN | 102858839 | A | 1/2013 | |
| CN | 102977551 | A | 3/2013 | |
| CN | 103265791 | A | 8/2013 | |
| CN | 103382242 | A | 11/2013 | |
| CN | 103421273 | A | 12/2013 | |
| CN | 103834168 | A | 6/2014 | |
| CN | 103992621 | A | 8/2014 | |
| CN | 104592467 | A | 5/2015 | |
| JP | S61167684 | A | 7/1986 | |
| JP | H01319528 | A | 12/1989 | |
| JP | 11052567 | A * | 2/1999 | ............. G03F 7/023 |
| JP | 2000186133 | A | 7/2000 | |
| JP | 2001348420 | A | 12/2001 | |
| JP | 2003231753 | A | 8/2003 | |
| JP | 2010053070 | A | 3/2010 | |
| JP | 2010053071 | A | 3/2010 | |
| JP | 2011173827 | A | 9/2011 | |
| WO | 2000037442 | A1 | 6/2000 | |
| WO | 2012124780 | A1 | 9/2012 | |
| WO | 2015127860 | A1 | 9/2015 | |
| WO | 2016101538 | A1 | 6/2016 | |

OTHER PUBLICATIONS

Kawabe, JP 11-052567 A machine translation in English, Feb. 26, 1999 (Year: 1999).*
Liu, Jia "Synthesis and Properties of Novel Heat Resistant, Halogen-Free Flame Retardant Epoxy Resin," Science-Engineering (A), China Master Thesis Full Text Database, vol. / No. 6 Jun. 15, 2013, pp. B016-161.

* cited by examiner

*Primary Examiner* — David T Karst
(74) *Attorney, Agent, or Firm* — McCarter & English, LLP; Steven G. Davis; Wei Song

(57) ABSTRACT

Provided in the present invention are a halogen-free epoxy resin composition, prepreg and laminate using the same, the halogen-free epoxy resin composition comprising: (A) a halogen-free epoxy resin; (B) a crosslinking agent; and (C) a phosphorous-containing phenolic resin, the phosphorous-containing phenolic resin being formed by a synthesis of phenol and formaldehyde with dicyclopentadiene phenol, and being substituted by 9,10-dihydro-9-oxa-10-phosphapheanthrene-10-oxide or a derivative thereof. The prepreg and laminate prepared from the halogen-free epoxy resin composition have a high heat resistance, a low dielectric constant, a low dielectric loss factor and a low water absorption rate, and achieve halogen-free flame retardance.

24 Claims, No Drawings

HALOGEN-FREE EPOXY RESIN COMPOSITION, PREPREG AND LAMINATE USING SAME

CROSS-REFERENCE TO RELATED APPLICATIONS

This application is a U.S. national stage filing, under 35 U.S.C. § 371(c), of International Application No. PCT/CN2015/080537, filed on Jun. 1, 2015, which claims priority to Chinese Patent Application No. 201410831480.6, filed on Dec. 26, 2014. The entire contents of each of the aforementioned applications are incorporated herein by reference.

TECHNICAL FIELD

The present invention belongs to the technical field of copper clad laminates, specifically relates to a halogen-free epoxy resin composition, and a prepreg, laminate and printed circuit board prepared therefrom.

BACKGROUND ART

Halogen flame retardants have been generally used in printed circuit boards to achieve flame retardancy. When halogen flame retardants combust, they emit heavy smoke and unpleasant odor, and produce hydrogen halide gas having a strong causticity. It is reported that, in recent years, halogen-containing flame retardants will produce carcinogen substances during pyrolysis and combustion, such as dioxins, dibenzofurans and the like. Waste Electrical and Electronic Equipment Directive and the Restriction of the Use of Certain Hazardous Substances in Electrical and Electronic Equipment were implemented by European Union on Jul. 1, 2006. The development of halogen-free flame retardant printed circuit boards has become a key point in the industry.

On the other aspect, the development of electronic components in the direction of light, thin, short, high performance and high function is accompanied by high frequency and high speed signal transmission. Besides, the delamination of high multi-layer PCB boards due to worse humidity and heat resistance and water absorption of CCL has attracted great attention.

DOPO is a common additive used in resin compositions, and is mainly used for increasing the flame retardancy of the resin composition and making the resin composition stable while being applied in high temperature environment.

Song Xiaoyun discloses synthesizing phosphorus-containing novolac resins by using DOPO and linear novolac (Song Xiaoyun, Synthesis and Application of Phosphorus-Containing Phenol Resin, Twelfth China CCL Market Symposium, 2009, p. 225).

CN103724997A discloses using polycyclic benzoxazine resins, multifunctional epoxy resins, and phosphorus-containing novolac resins which are linear phosphorus-containing novolac resins and have worse dielectric properties and water absorption although having a higher heat resistance.

CN 102585126B discloses reacting phenol with phosphorus oxychloride to synthesize a phosphorous-containing compound, then reacting with novolac resin to synthesize a phosphorous-containing novolac resin.

CN102206397B discloses using epoxy resins, hardening accelerators, crosslinking agents and phosphorous-containing resins which are bisphenol novolac resins replaced with 9,10-dihydro-9-oxa-10-phosphapheanthrene-10-oxide or derivatives thereof, to synthesize a copper clad laminate. Due to the presence of bisphenol structure in such phosphorous-containing novolac resin, it has worse humidity and heat resistance, high water absorption and worse dielectric properties.

CN 103382242A discloses synthesizing novolac resins by using phenol compounds, bisphenol compounds and formaldehyde, mixing novolac resins with aromatic phosphates to carry out a polycondensation and to obtain phosphorous-containing flame retardant novolac resins. The structures of bisphenol compounds and phenol compounds are used to improve the heat resistance of the current phosphorous-containing bisphenol novolac resins alone. However, the bisphenol compounds in the structure are bisphenol A/bisphenol F/bisphenol S and the like, and their heat resistance, dielectric properties and water absorption need to be further improved.

Therefore, it is the technical problem to be solved in the art how to have good dielectric properties and low water absorption, while having high heat resistance, and to achieve halogen-free flame retardancy.

DISCLOSURE OF THE INVENTION

As for the problems in the prior art, the object of the present invention lies in providing a halogen-free epoxy resin composition, and a prepreg and laminate prepared therefrom. The laminate prepared from such halogen-free epoxy resin composition has the advantages of high heat resistance, low dielectric constant, low dielectric loss and low water absorption, and can achieve halogen-free flame retardancy.

In order to achieve such object, the inventor conducted extensive studies and found that the composition obtained by suitably mixing epoxy resin, crosslinking agent, phosphorous-containing novolac resin, and other optional components can achieve such object.

The present invention discloses a halogen-free epoxy resin composition, comprising
(A) a halogen-free epoxy resin;
(B) a crosslinking agent; and
(C) a phosphorous-containing novolac resin having the following structure

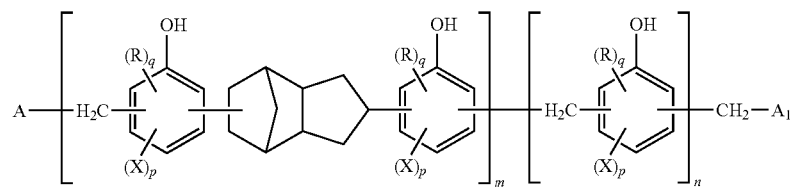

A and A₁ are both dependently

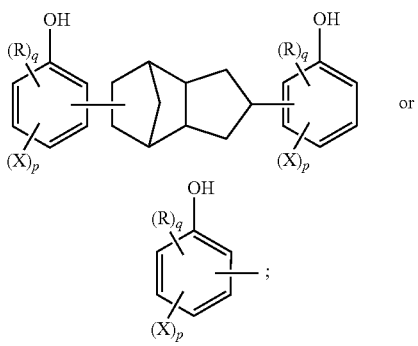

p, q, m and n represent the numbers of repeating units and are independently integers which are greater than or equal to 1;
X is 9,10-dihydro-9-oxa-10-phosphapheanthrene-10-oxide or derivatives thereof; X in different structures may be identical or different from each other;
R is selected from the group consisting of hydrogen, aliphatic functional groups or aromatic functional groups; R in different structures may be identical or different from each other.

In the present invention, the phosphorous-containing novolac resin is a novolac resin which is synthesized from dicyclopentadiene phenol replaced with 9,10-dihydro-9-oxa-10-phosphapheanthrene-10-oxide or derivatives thereof, together with phenol and formaldehyde, and can be used as curing agent for epoxy resins and can provide halogen-free flame retardancy property. The phosphorous-containing novolac resin of the present invention has better flame retardancy than other kinds of phosphate compounds, and has better crosslinking property than DOPO compounds or DOPO-HQ resin, and can increase the crosslinking density, reactivity and glass transition temperature. Due to the presence of dicyclopentadiene ring having high heat resistance, good dielectric properties and low water absorption in the structure thereof, the phosphorous-containing novolac resin has the advantages of high heat resistance, low dielectric constant, low dielectric loss and low water absorption.

In the present invention, the addition of epoxy resin can apparently improve the toughness and curing crosslinking density of the cured products.

The crosslinking agent in the present invention can effectively increase the crosslinking curing effect with epoxy resins.

The present invention utilizes the mutual cooperation and mutual synergistic effect of said three essential components to obtain the aforesaid halogen-free epoxy resin composition. The prepreg and laminate prepared from such halogen-free epoxy resin composition has the advantages of high heat resistance, low dielectric constant, low dielectric loss and low water absorption, and can achieve halogen-free flame retardancy.

Preferably, the halogen-free epoxy resin is selected from the group consisting of biphenyl novolac epoxy resin, DCPD novolac epoxy resin, alkylene novolac epoxy resin, bisphenol A novolac epoxy resin, bisphenol Z epoxy resin, bisphenol AP epoxy resin, bisphenol TMC epoxy resin, biphenyl-containing epoxy resin, tetramethyl biphenyl epoxy resin, phenol novolac epoxy resin, cresol novolac epoxy resin, triphenyl methane epoxy resin, tetraphenyl ethane epoxy resin, dicyclopentadiene-phenol addition reaction epoxy resin, phenol aralkyl epoxy resin, naphthol novolac epoxy resin, naphthol aralkyl epoxy resin, naphthol-phenol co-condensation novolac epoxy resin, naphthol-cresol co-condensation novolac epoxy resin, aromatic hydrocarbon formaldehyde resin-modified novolac epoxy resin or biphenyl-modified novolac epoxy resin, or a mixture of at least two selected therefrom.

Further preferably, the halogen-free epoxy resin is selected from the group consisting of biphenyl novolac epoxy resin, DCPD novolac epoxy resin or bisphenol A novolac epoxy resin, or a mixture of at least two selected therefrom, which has high heat resistance.

More preferably, the halogen-free epoxy resin is biphenyl novolac epoxy resin or/and DCPD novolac epoxy resin, which has good heat resistance and dielectric properties.

Preferably, the crosslinking agent is selected from the group consisting of active esters, anhydride compounds or novolac resins, or a mixture of at least two selected therefrom.

Preferably, the active esters are active ester crosslinking agents having functional ester groups; the anhydride compounds may be styrene maleic anhydride and the like. Novolac resins may be hydroxyl-containing novolac resins, such as linear novolac resin, bisphenol novolac resin, alkyl novolac resin, DCPD novolac resin and the like.

Further preferably, the crosslinking agent is selected from the group consisting of active esters or/and anhydride compounds, which have better dielectric properties than novolac resins.

More preferably, the crosslinking agents are active esters having the following structure. Due to the special structure therein, the rigid structure therein, such as benzene ring, naphthalene ring, cyclopentadiene and the like, endows the active esters with a high heat resistance. Meanwhile, the structural regularity, and no production of secondary hydroxyl group in the reaction with epoxy resin endow with better electric properties and a low water absorption.

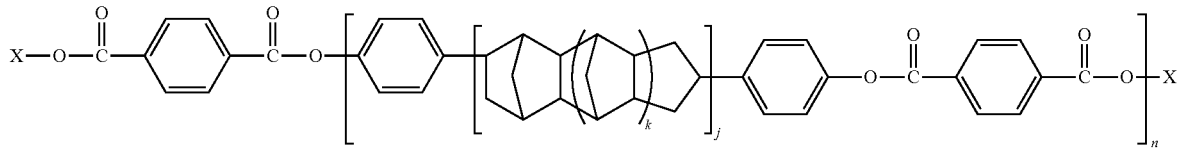

X is phenyl or naphthyl; j is 0 or 1; k is 0 or 1; n represents the number of repeating unit which is 0.25-1.25.

Preferably, based on the addition amount of the halogen-free epoxy resin which is 100 parts by weight, the phosphorous-containing novolac resin is from 30 to 70 parts by weight, e.g. 35, 40, 45, 50, 55, 60 or 65 parts by weight, preferably from 35 to 65 parts by weight; the crosslinking agent is from 27 to 58 parts by weight, preferably from 35 to 55 parts by weight.

Preferably, the halogen-free epoxy resin composition further comprises cyanate or benzoxazine, which may increase the glass transition temperature of the composition, and can achieve N—P synergistic flame retardancy together with phosphorous-containing novolac resin and increase flame retardant efficiency.

Further preferably, the cyanate may be cyanate compounds containing at least two cyanato groups in the molecules, such as bisphenol A cyanate and the like, or prepolymers thereof, which may better increase glass transition temperature than benzoxazine.

Based on the total addition amount of components (A), (B) and (C) which is 100 parts by weight, the cyanates or prepolymers thereof are added in an amount of from 20 to 40 parts by weight, e.g. 22, 24, 26, 28, 30, 32, 34, 36 or 38 parts by weight.

Preferably, the halogen-free epoxy resin composition further comprises a curing accelerator, which cures the resins and speeds up the curing rate of resins.

Preferably, based on the total addition amount of components (A), (B) and (C) which is 100 parts by weight, the curing accelerator is added in an amount of from 0.05 to 1 part by weight, e.g. 0.08, 0.1, 0.15, 0.2, 0.25, 0.3, 0.35, 0.4, 0.45, 0.5, 0.5, 0.60, 0.65, 0.7, 0.75, 0.8, 0.85, 0.9 or 0.95 part by weight.

Preferably, the curing accelerator is selected from the group consisting of 4-dimethylaminopyridine, 2-methylimidazole, 2-methyl-4-ethylimidazole or 2-phenyl-imidazole, zinc isooctanoate, or a mixture of at least two selected therefrom.

In order to further increase the flame retardant property of the halogen-free epoxy resin composition, the present invention discloses that, in the case of the preferred circumstance, at least one specific flame retardant compound may be optionally added.

Preferably, the halogen-free epoxy resin composition further comprises a flame retardant compound, wherein said flame retardant compound is flame retardant salts, preferably phosphate compounds, or nitrogen-containing phosphate compounds, but is not limited thereto.

Preferably, based on the total addition amount of components (A), (B) and (C) which is 100 parts by weight, the flame retardant compound is added in an amount of from 0 to 50 parts by weight, excluding 0, e.g. 5, 10, 15, 20, 25, 30, 35, 40, 45 or 50 parts by weight.

Preferably, the halogen-free epoxy resin composition further comprises a filler, wherein said filler is organic or/and inorganic fillers and is primarily used to adjust some physical property effects of the composition, e.g. reducing the coefficient of thermal expansion (CTE), reducing the water absorption and increasing the thermal conductivity and the like.

Preferably, based on the total addition amount of components (A), (B) and (C) which is 100 parts by weight, the filler is added in an amount of from 0 to 100 parts by weight, excluding 0, preferably from 0 to 50 parts by weight, excluding 0. The filler is added in an amount of, e.g. 0.5, 1, 5, 10, 15, 20, 25, 30, 35, 40, 45, 50, 55, 60, 65, 70, 75, 80, 85, 90 or 95 parts by weight.

Preferably, the inorganic filler is selected from the group consisting of molten silica, crystalline silica, spherical silica, hollow silica, aluminium hydroxide, alumina, talc, aluminium nitride, boron nitride, silicon carbide, barium sulfate, barium titanate, strontium titanate, calcium carbonate, calcium silicate, mica or glass fiber powder, or a mixture of at least two selected therefrom. The mixture is selected from the group consisting of, e.g. a mixture of molten silica and crystalline silica, a mixture of spherical silica and hollow silica, a mixture of aluminium hydroxide and alumina, a mixture of talc and aluminium nitride, a mixture of boron nitride and silicon carbide, a mixture of barium sulfate and barium titanate, a mixture of strontium titanate and calcium carbonate, a mixture of calcium silicate, mica and glass fiber powder, a mixture of molten silica, crystalline silica and spherical silica, a mixture of hollow silica, aluminium hydroxide and alumina, a mixture of talc, aluminium nitride and boron nitride, a mixture of silicon carbide, barium sulfate and barium titanate, a mixture of strontium titanate, calcium carbonate, calcium silicate, mica and glass fiber powder.

Preferably, the organic filler is selected from the group consisting of polytetrafluoroethylene powder, polyphenylene sulfide or polyether sulfone powder, or a mixture of at least two selected therefrom. The mixture is selected from the group consisting of, e.g. a mixture of polytetrafluoroethylene powder and polyphenylene sulfide, a mixture of polyether sulfone powder and polytetrafluoroethylene powder, a mixture of polyphenylene sulfide and polyether sulfone powder, and a mixture of polytetrafluoroethylene powder, polyphenylene sulfide and polyether sulfone powder.

Preferably, the filler is silica having a moderate particle size of from 1 to 15 μm, preferably from 1 to 10 μm.

The wording "comprise(s)/comprising" in the present invention means that, besides said components, there may be other components which endow the epoxy resin composition with different properties. In addition, the wording "comprise(s)/comprising" in the present invention may be replaced with "is/are" or "consist(s)/consisting of" in a close manner.

For example, the halogen-free epoxy resin composition further comprises various additives, specifically e.g. antioxidants, heat stabilizers, antistatic agents, UV absorbers, pigments, colorants, lubricants and the like. These various additives may be used alone, or in combination.

The conventional process for preparing the halogen-free epoxy resin composition of the present invention comprises taking a container, placing the solid components first, then adding the liquid solvent, stirring till complete dissolving, adding the liquid resin, filler, flame retardant and curing accelerator, continuing to homogeneously stir, and finally adjusting with the solvent the solid content to 60%-80% to obtain a varnish.

The second object of the present invention is to provide a prepreg comprising a reinforcing material and the halogen-free epoxy resin composition attached thereon after impregnation and drying.

The exemplary reinforcing materials are non-woven fabrics or/and other fabrics, e.g. natural fibers, organic synthetic fibers and inorganic fibers.

Such varnish is used to impregnate the reinforcing materials, such as fabrics such as glass fabrics, or organic fabrics, and the impregnated reinforcing materials are heated and dried in an oven at 155-170° C. for 5-10 min to obtain a prepreg.

The third object of the present invention is to provide a laminate comprising at least one prepreg above.

The fourth object of the present invention is to provide a printed circuit board comprising at least one prepreg above.

As compared to the prior art, the present invention has the following beneficial effects.

The phosphorous-containing novolac resin in the present invention can be used as the curing agent of epoxy resins, and can also provide halogen-free flame retardancy. Moreover, the main chain thereof contains dicyclopentadiene ring, which makes it have low dielectric constant, low dielectric loss, low water absorption and higher glass transition temperature.

The prepreg, laminate and metal clad laminate prepared from such halogen-free epoxy resin composition have the advantages of high heat resistance, low dielectric constant, low dielectric loss and low water absorption, and can achieve halogen-free flame retardancy.

EMBODIMENTS

The technical solution of the present invention is further explained by the following embodiments.

The halogen-free epoxy resin composition metal-clad laminate was tested for glass transition temperature, dielectric constant, dielectric loss factor, and PCT and PCT water absorption and flammability thereof, which are detailedly stated and described below, wherein the mass part of the organic resin are based on the mass part of organic solids.

Preparation Example: novolac resin synthesized from dicyclopentadiene phenol replaced with 9,10-dihydro-9-oxa-10-phosphapheanthrene-10-oxide or derivatives thereof, together with phenol and formaldehyde.

94 g of phenol was added to a four-necked flask with a stirrer, a thermometer and a reflux condenser, and dissolved by heating in a water bath. 0.1 g of boron trifluoride.ether was weighed, and added into the four-necked flask. 66 g of dicyclopentadiene was added to a dropping funnel. The dropping rate was controlled so as to finish the dropping of all dicyclopentadiene within two hours. The temperature was raised to 60° C. and remained for 2 h, and then cooled to room temperature. The temperature was then raised to a certain extent to distill excessive dicyclopentadiene and phenol, so as to obtain dicyclopentadiene phenol having the following structure.

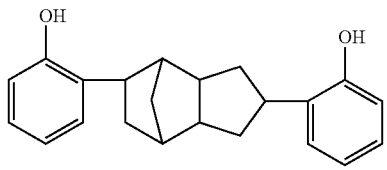

Into a four-necked flask were added 226 g of dicyclopentadiene phenol obtained above, 94 g of phenol, 80 g of 37 wt. % formaldehyde aqueous solution, 0.2 g of dimethylimidazole and 250 g of a solvent of methyl isobutyl ketone, reacted at 150° C. for 6-8 h. After the reaction, the mixture was water-washed, and the solvent was removed to obtain an intermediate.

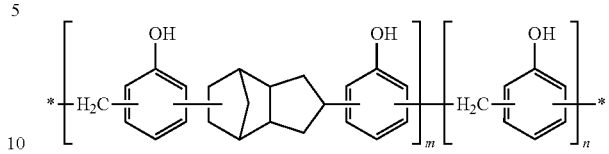

Into a reactor equipped with a reflux condenser, stirrer and thermocouple were added 180 g of the intermediate, 216 g of DOPO, 1.5 g of potassium acetate, and 150 g of xylene, heated to 170° C., stirred, refluxed and reacted for 8 h. After cooling, 250 g of n-butanol was added. Extraction was carried three times to distill n-butanol and xylene. Then a suitable amount of propylene glycol methyl ether was added to formulate a phosphorous-containing dicyclopentadiene phenol resin having a solid content of 60%.

Example 1

100 parts by weight of NC-3000H and 41 parts by weight of EF-40 were added into a vessel; a suitable amount of MEK was added, stirred and dissolved. Then 54 parts by weight of the phosphorous-containing novolac resin prepared in Preparation Example 1 was added and stirred. A suitable amount of curing accelerator 2E4MI was added, and continuously and homogeneously stirred. Finally, a solvent was used to adjust the solid content of the liquid to 60%-80% and to prepare a varnish. The glass fiber cloth was impregnated with the aforesaid varnish to control to an appropriate thickness, then dried to remove the solvent and obtain a prepreg. Several prepregs were laminated to each other, and covered with a sheet of copper foil on both sides thereof, placed in a hot press and cured to obtain epoxy resin copper clad laminates. The physical property data are shown in Table 1.

Examples 2-9

The preparation processes are the same as that in Example 1, and the composition formulations and the physical indexes are shown in Table 1 below.

Comparison Examples 1-3

The preparation processes are the same as that in Example 1, and the composition formulations and the physical indexes are shown in Table 2 below.

TABLE 1

Composition formulation and physical indexes in each Example

| | Substances | Example 1 | Example 2 | Example 3 | Example 4 | Example 5 | Example 6 | Example 7 | Example 8 | Example 9 |
|---|---|---|---|---|---|---|---|---|---|---|
| Epoxy resin | NC-3000H | 100 | | | 100 | 100 | 100 | 100 | 100 | 100 |
| | 7200H-M75 | | 100 | | | | | | | |
| | 627 | | | 100 | | | | | | |
| Crosslinking agent | HPC-8000-65T | | | | 43 | 43 | 58 | 54 | 43 | 30 |
| | EF-40 | 41 | | | | | | | | |
| | 2812 | | 27 | 36 | | | | | | |

TABLE 1-continued

Composition formulation and physical indexes in each Example

| | Substances | Example 1 | Example 2 | Example 3 | Example 4 | Example 5 | Example 6 | Example 7 | Example 8 | Example 9 |
|---|---|---|---|---|---|---|---|---|---|---|
| Cyanate | CE01PS | | | | 20 | 40 | | | | |
| Phosphorous-containing phenol | B1 | 54 | 33 | 44 | 54 | 54 | 30 | 38 | 53 | 70 |
| | B2 | | | | | | | | — | |
| | B3 | | | | | | | | | |
| Accelerator | 2E4MI | | q.s. | q.s. | q.s. | q.s. | q.s. | q.s. | q.s. | q.s. |
| | DMAP | | | | q.s. | q.s. | q.s. | q.s. | q.s. | q.s. |
| | Zinc isooctanoate | | | | q.s. | q.s. | | | | |
| Performance | $T_g$ | 190 | 192 | 193 | 191 | 192 | 175 | 180 | 185 | 190 |
| | $D_k$ | 3.61 | 3.75 | 3.78 | 3.63 | 3.64 | 3.59 | 3.6 | 3.62 | 3.65 |
| | $D_f$ | 0.0092 | 0.01 | 0.012 | 0.0089 | 0.0088 | 0.0079 | 0.008 | 0.0085 | 0.0088 |
| | PCT | >5' | >5' | >5' | >5' | >5' | >5' | >5' | >5' | >5' |
| | PCT water absorption | 0.30% | 0.27% | 0.29% | 0.25% | 0.26% | 0.20% | 0.20% | 0.22% | 0.23% |
| | Flammability | V-0 | V-0 | V-0 | V-0 | V-0 | V-0 | V-0 | V-0 | V-0 |

TABLE 2

Composition formulation and physical indexes in each Comparison Example

| | Substances | Comp. Example 1 | Comp. Example 2 | Comp. Example 3 |
|---|---|---|---|---|
| Epoxy resin | NC-3000H | 100 | 100 | |
| | 7200H-M75 | | | |
| | 627 | | | 100 |
| Crosslinking agent | HPC-8000-65T | 30 | 30 | |
| | EF-40 | | | |
| | 2812 | | | 36 |
| Cyanate | CE01PS | | | |
| Phosphorous-containing phenol | B1 | | | |
| | B2 | | 70 | 44 |
| | B3 | 70 | | |
| Accelerator | 2E4MI | q.s. | q.s. | q.s. |
| | DMAP | q.s. | q.s. | |
| | Zinc isooctanoate | | | |
| Performance | $T_g$ | 165 | 178 | 183 |
| | $D_k$ | 3.83 | 3.85 | 3.92 |
| | $D_f$ | 0.012 | 0.011 | 0.015 |
| | PCT | 3" | 3" | 3" |
| | PCT water absorption | 0.35% | 0.37% | 0.42% |
| | Flammability | V-0 | V-0 | V-0 |

Note:
based on parts by weight of solid components.
The materials listed in Tables 1 and 2 are stated as follows specifically:
B1: novolac resin synthesized from dicyclopentadiene phenol replaced with 9,10-dihydro-9-oxa-10-phosphapheanthrene-10-oxide or derivatives thereof, together with phenol and formaldehyde
B2: novolac resin (Jiangsu Yoke DHP-60H) synthesized from bisphenol A replaced with aromatic phosphates, together with phenol and formaldehyde
B3: phosphorous-containing bisphenol A novolac resin from DOW (DOW Chemical XZ92741)
NC-3000H: Biphenyl novolac epoxy resin (Product from Nippon Kayaku)
7200H-M75: DCPD novolac epoxy resin (product form DIC)
627: Bisphenol A novolac epoxy resin (product form Hexion)
HPC-8000-65T: active ester curing agent (product form DIC)
EF-40: styrene maleic anhydride (product from Sartomer)
2812: linear novolac resin (product from Momentive)
CE01PS: Bisphenol A cyanate (product from Yangzhou Apocalypse)
2E4MI: Curing accelerator, 2-methyl-4-ethylimidazole (product from Japan Shikoku Chemicals)
DMAP: Curing accelerator, 4-dimethylaminopyridine (product from Guangrong Chemical)
Zinc isooctanoate: Curing accelerator (product from Alfa Aesar)

The aforesaid properties are tested by the following methods.

(1) Glass transition temperature (Tg): tested by the DSC method under IPC-TM-6502.4.25 in accordance with Differential scanning calorimetry (DSC).

(2) Dielectric constant and dielectric loss factor: tested by the method under IPC-TM-6502.5.5.9 at a testing frequency of 10 GHz.

(3) PCT and PCT water absorption: etching the copper foil on the surface of the copper clad laminates to evaluate the boards; placing the boards in a pressure cooker and treating at 120° C. and 150 KPa for 2 h, impregnating in a tin stove at 288° C., recoding the corresponding time when splitting appeared in the boards; when there was no blistering or delamination after the boards were in the tin stove for 5 min, the evaluation may be ended.

(4) flammability is tested according to the testing method of UL-94.

Analyses on Physical Properties

According to the physical properties in Tables 1 and 2, it can be seen that the laminates using phosphorous-containing novolac resins in Comparison Examples have the disadvantages of PCT delamination, worse dielectric properties and humidity and heat resistance and low glass transition temperature. In Examples 1-9, the composition of the halogen-free epoxy resin, crosslinking agent, and the phosphorous-containing novolac resin synthesized from dicyclopentadiene phenol replaced with 9,10-dihydro-9-oxa-10-phosphapheanthrene-10-oxide together with phenol and formaldehyde has the advantages of high heat resistance, low dielectric constant, low dielectric loss and low water absorption, and can achieve halogen-free flame retardancy.

As stated above, the halogen-free circuit board of the present invention, as compared to the general laminates, has the advantages of high heat resistance, low dielectric constant, low dielectric loss and low water absorption, and can achieve halogen-free flame retardancy.

The aforesaid examples are only better examples of the present invention. Those ordinarily skilled in the art can make various corresponding changes and modifications according to the technical solution and technical concept of the present invention. Moreover, all these changes and modifications shall fall within the protection scope of the claims of the present invention.

The applicant declares that, the present invention discloses the detailed method of the present invention by the aforesaid examples, but the present invention is not limited by the detailed method, i.e. it does not mean that the present invention cannot be fulfilled unless the aforesaid detailed method is used. Those skilled in the art shall know that, any amendment, equivalent change to the product materials of the present invention, addition of auxiliary ingredients, and selection of any specific modes all fall within the protection scope and disclosure scope of the present invention.

The invention claimed is:

1. A halogen-free epoxy resin composition, comprising
   (A) a halogen-free epoxy resin;
   (B) a crosslinking agent; and
   (C) a phosphorous-containing novolac resin having the following structure

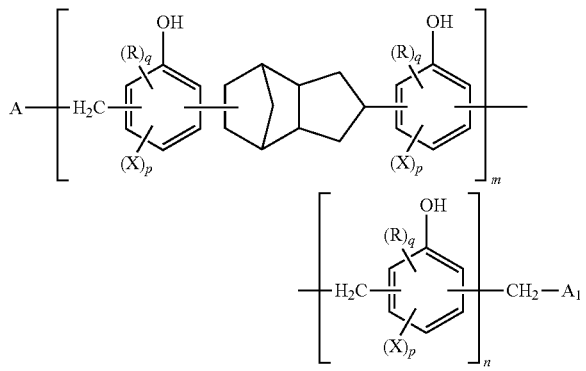

A and $A_1$ are both dependently

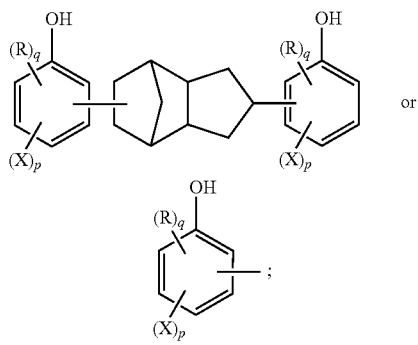

p, q, m and n represent the numbers of repeating units and are independently integers which are greater than or equal to 1;
   X is 9,10-dihydro-9-oxa-10-phosphapheanthrene-10-oxide or derivatives thereof;
   R is selected from the group consisting of hydrogen, aliphatic functional groups or aromatic functional groups.

2. The halogen-free epoxy resin composition according to claim 1, characterized in that the halogen-free epoxy resin is selected from the group consisting of biphenyl novolac epoxy resin, DCPD novolac epoxy resin, alkylene novolac epoxy resin, bisphenol A novolac epoxy resin, bisphenol F epoxy resin, bisphenol Z epoxy resin, bisphenol AP epoxy resin, bisphenol TMC epoxy resin, biphenyl-containing epoxy resin, tetramethyl biphenyl epoxy resin, phenol novolac epoxy resin, cresol novolac epoxy resin, triphenyl methane epoxy resin, tetraphenyl ethane epoxy resin, dicyclopentadiene-phenol addition reaction epoxy resin, phenol aralkyl epoxy resin, naphthol novolac epoxy resin, naphthol aralkyl epoxy resin, naphthol-phenol co-condensation novolac epoxy resin, naphthol-cresol co-condensation novolac epoxy resin, aromatic hydrocarbon formaldehyde resin-modified novolac epoxy resin, biphenyl-modified novolac epoxy resin or imide-modified epoxy resin, or a mixture of at least two selected therefrom.

3. The halogen-free epoxy resin composition according to claim 1, characterized in that the halogen-free epoxy resin is selected from the group consisting of biphenyl novolac epoxy resin, DCPD novolac epoxy resin or bisphenol A novolac epoxy resin, or a mixture of at least two selected therefrom.

4. The halogen-free epoxy resin composition according to claim 1, characterized in that the halogen-free epoxy resin is biphenyl novolac epoxy resin or/and DCPD novolac epoxy resin.

5. The halogen-free epoxy resin composition according to claim 1, characterized in that the crosslinking agent is selected from the group consisting of active esters, anhydride compounds or novolac resins, or a mixture of at least two selected therefrom.

6. The halogen-free epoxy resin composition according to claim 1, characterized in that the halogen-free epoxy resin composition further comprises cyanates or prepolymers thereof.

7. The halogen-free epoxy resin composition according to claim 6, characterized in that based on the total addition amount of components (A), (B) and (C) which is 100 parts by weight, the cyanates or prepolymers thereof are added in an amount of from 20 to 40 parts by weight.

8. The halogen-free epoxy resin composition according to claim 1, characterized in that the halogen-free epoxy resin composition further comprises a curing accelerator.

9. The halogen-free epoxy resin composition according to claim 8, characterized in that based on the total addition amount of components (A), (B) and (C) which is 100 parts by weight, the curing accelerator is added in an amount of from 0.05 to 1 part by weight.

10. The halogen-free epoxy resin composition according to claim 8, characterized in that the curing accelerator is selected from the group consisting of 4-dimethylaminopyridine, 2-methylimidazole, 2-methyl-4-ethylimidazole or 2-phenyl-imidazole, zinc isooctanoate, or a mixture of at least two selected therefrom.

11. The halogen-free epoxy resin composition according to claim 1, characterized in that the halogen-free epoxy resin composition further comprises a flame retardant compound, the flame retardant compound is flame retardant salts.

12. The halogen-free epoxy resin composition according to claim 11, characterized in that based on the total addition amount of components (A), (B) and (C) which is 100 parts by weight, the flame retardant compound is added in an amount of from 0 to 50 parts by weight, excluding 0.

13. The halogen-free epoxy resin composition according to claim 1, characterized in that the halogen-free epoxy resin composition further comprises a filler, the filler is organic or/and inorganic fillers.

14. The halogen-free epoxy resin composition according to claim 13, characterized in that based on the total addition amount of components (A), (B) and (C) which is 100 parts by weight, the filler is added in an amount of from 0 to 100 parts by weight, excluding 0.

15. The halogen-free epoxy resin composition according to claim 13, characterized in that the inorganic filler is selected from the group consisting of molten silica, crystalline silica, spherical silica, hollow silica, aluminium hydroxide, alumina, talc, aluminium nitride, boron nitride, silicon carbide, barium sulfate, barium titanate, strontium titanate, calcium carbonate, calcium silicate, mica or glass fiber powder, or a mixture of at least two selected therefrom.

16. The halogen-free epoxy resin composition according to claim 13, characterized in that the organic filler is selected from the group consisting of polytetrafluoroethylene powder, polyphenylene sulfide or polyether sulfone powder, or a mixture of at least two selected therefrom.

17. The halogen-free epoxy resin composition according to claim 13, characterized in that the filler is silica having a moderate particle size of from 1 to 15 μm.

18. A prepreg comprising a reinforcing material and the halogen-free epoxy resin composition according to claim 1 attached thereon after impregnation and drying.

19. A laminate comprising at least one prepreg according to claim 18.

20. A printed circuit board comprising at least one prepreg according to claim 18.

21. The halogen-free epoxy resin composition according to claim 1, characterized in that the crosslinking agent is selected from the group consisting of active esters or anhydride compounds.

22. The halogen-free epoxy resin composition according to claim 1, characterized in that the crosslinking agent is active esters.

23. The halogen-free epoxy resin composition according to claim 1, characterized in that the crosslinking agent is selected from the group consisting of active esters having the following structures

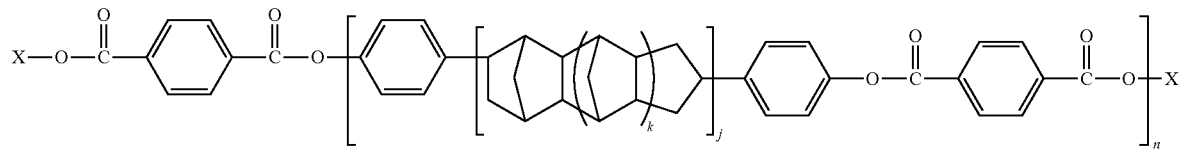

X is phenyl or naphthyl; j is 0 or 1; k is 0 or 1; n represents the number of repeating unit which is 0.25-1.25.

24. The halogen-free epoxy resin composition according to claim 1, characterized in that based on the addition amount of the halogen-free epoxy resin which is 100 parts by weight, the phosphorous-containing novolac resin is from 30 to 70 parts by weight; the crosslinking agent is from 27 to 58 parts by weight.

* * * * *